(12) United States Patent  
Chen et al.

(10) Patent No.: US 12,027,506 B2  
(45) Date of Patent: *Jul. 2, 2024

(54) ELECTRONIC DEVICE AND METHOD OF MANUFACTURING ELECTRONIC DEVICE

(71) Applicant: Innolux Corporation, Miao-Li County (TW)

(72) Inventors: Yi-An Chen, Miao-Li County (TW); Kuan-Hung Kuo, Miao-Li County (TW); Tsau-Hua Hsieh, Miao-Li County (TW); Kai Cheng, Miao-Li County (TW); Wan-Ling Huang, Miao-Li County (TW)

(73) Assignee: Innolux Corporation, Miaoli County (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/149,661

(22) Filed: Jan. 3, 2023

(65) Prior Publication Data

US 2023/0145293 A1    May 11, 2023

Related U.S. Application Data

(63) Continuation of application No. 17/026,325, filed on Sep. 21, 2020, now Pat. No. 11,574,897.

(30) Foreign Application Priority Data

Oct. 9, 2019    (CN) .......................... 201910955815.8

(51) Int. Cl.  
   *H01L 33/56*       (2010.01)  
   *H01L 25/13*       (2006.01)

(52) U.S. Cl.  
   CPC .............. *H01L 25/13* (2013.01); *H01L 33/56* (2013.01); *H01L 2933/005* (2013.01)

(58) Field of Classification Search  
   CPC .... H01L 25/13; H01L 33/56; H01L 2933/005  
   See application file for complete search history.

(56) References Cited

U.S. PATENT DOCUMENTS 11,574,897 B2 *    2/2023   Chen ....................... H01L 25/13

OTHER PUBLICATIONS

"Office Action of China Counterpart Application", dated Dec. 11, 2023, p. 1-p. 8.

* cited by examiner

*Primary Examiner* — Samuel A Gebremariam  
(74) *Attorney, Agent, or Firm* — JCIPRNET

(57) ABSTRACT

The disclosure provides an electronic device and a method of manufacturing an electronic device. The electronic device includes a first substrate, a plurality of light-emitting diodes, a second substrate, a transparent material layer, and a sealing material. The first substrate comprises a first substrate body. The plurality of light-emitting diodes are disposed on the first substrate body. The second substrate is disposed opposite to the first substrate, and comprises a second substrate body. The transparent material layer is disposed between the first substrate and the second substrate. The sealing material is disposed between the first substrate and the second substrate and surrounds the transparent material layer. A distance between a bottom surface of the sealing material and a top surface of the first substrate body is less than a distance between a top surface of the sealing material and a bottom surface of the second substrate body.

12 Claims, 6 Drawing Sheets

ELECTRONIC DEVICE AND METHOD OF MANUFACTURING ELECTRONIC DEVICE

CROSS-REFERENCE TO RELATED APPLICATION

This application is a continuation application of and claims the priority benefit of a prior application Ser. No. 17/026,325, filed on Sep. 21, 2020, which claims the priority benefit of China application serial no. 201910955815.8, filed on Oct. 9, 2019. The entirety of each of the above-mentioned patent applications is hereby incorporated by reference herein and made a part of this specification.

BACKGROUND

Technical Field

The disclosure relates to an electronic device and a method of manufacturing an electronic device.

Description of Related Art

With the advancement in technology, the electronic devices have been incorporated into various types of products, such as the electronic devices having the light-emitting diodes. As the requirements for the electronic devices continue to increase, it has become one of the directions for development to increase the operating service life of the electronic device or improve the packaging technique for the electronic devices.

SUMMARY

According to an embodiment of the disclosure, an electronic device includes a first substrate, a plurality of light-emitting diodes, a second substrate, a transparent material layer, and a sealing material. The first substrate comprises a first substrate body. The plurality of light-emitting diodes are disposed on the first substrate body. The second substrate is disposed opposite to the first substrate, and comprises a second substrate body. The transparent material layer is disposed between the first substrate and the second substrate. The sealing material is disposed between the first substrate and the second substrate and surrounds the transparent material layer. A distance between a bottom surface of the sealing material and a top surface of the first substrate body is less than a distance between a top surface of the sealing material and a bottom surface of the second substrate body.

According to an embodiment of the disclosure, a method of manufacturing an electronic device includes the following steps. A first substrate and a second substrate are provided, and a plurality of light-emitting dies are disposed on the first substrate. A transparent material layer and a sealing material are disposed on the first substrate or the second substrate, and the sealing material surrounds the transparent material layer. The first substrate and the second substrate are assembled.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1D is a schematic cross-sectional view showing the electronic device according to the embodiment of the disclosure.

DESCRIPTION OF THE EMBODIMENTS

Figure 1A:
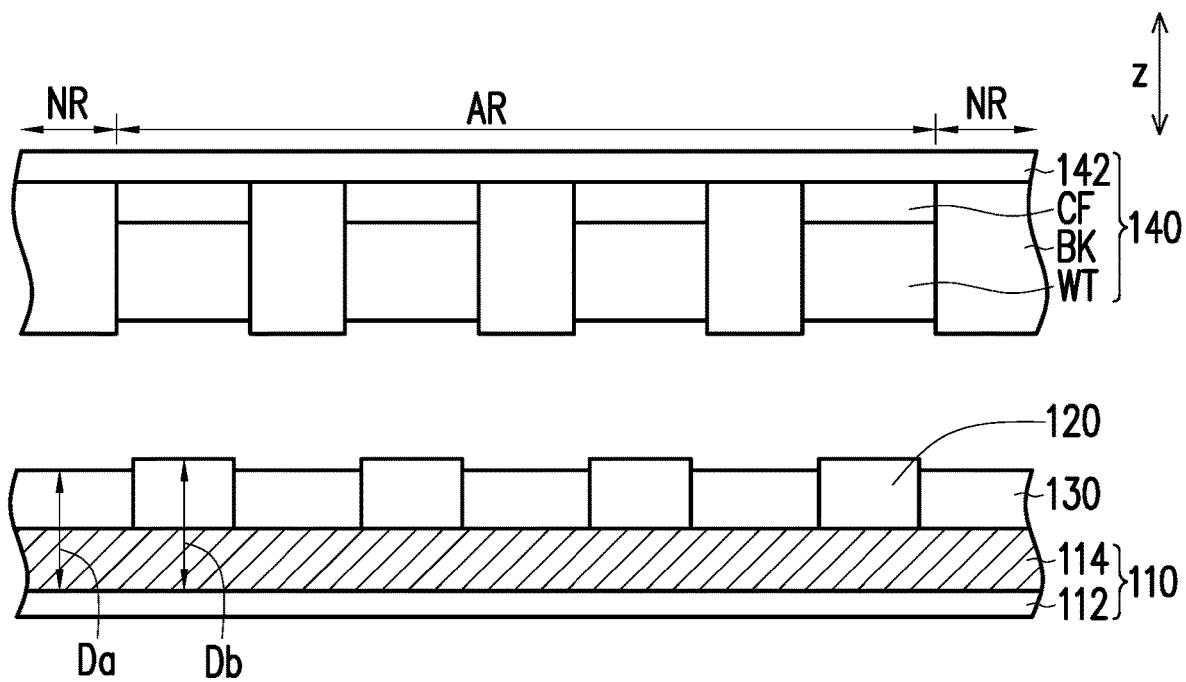
FIG. 1A to FIG. 1D are schematic views showing part of a manufacturing process of an electronic device according to an embodiment of the disclosure.

The disclosure may be understood by referring to the following detailed description with reference to the accompanying drawings. It noted that for comprehension of the reader and simplicity of the drawings, in the drawings of the disclosure, only a part of the electronic device is shown, and specific components in the drawings are not necessarily drawn to scale. Moreover, the quantity and the size of each component in the drawings are only schematic and are not intended to limit the scope of the disclosure.

"A structure (or layer, component, substrate, etc.) being located on/above another structure (or layer, component, substrate, etc.)" as described in the disclosure may mean that the two structures are adjacent and directly connected, or may mean that the two structures are adjacent but are not directly connected. "Not being directly connected" means that at least one intermediate structure (or intermediate layer, intermediate component, etc.) is present between the two structures, where the lower surface of one structure is adjacent or directly connected to the upper surface of the intermediate structure, the upper surface of the other structure is adjacent or directly connected to the lower surface of the intermediate structure, and the intermediate structure may be composed of a single-layer or multi-layer physical structure or non-physical structure and is not specifically limited herein. In the disclosure, when one structure is disposed "on" another structure, it may mean that the one structure is "directly" on the another structure, or may mean that the one structure is "indirectly" on the another structure (i.e., at least one other structure is interposed between the one structure and the another structure).

Electrical connection or coupling as described in the disclosure may both refer to direct connection or indirect connection. In the case of direct connection, the terminal points of two components of the circuit are directly connected or are connected to each other via a conductor line. In the case of indirect connection, a combination of one of a switch, a diode, a capacitor, an inductor or another non-conductor line segment and at least one conductive segment or a resistor, or a combination of at least two of the above components and at least one conductive segment or a resistor is present between the terminal points of two components on the circuit.

In the disclosure, the thickness, the length, and the width may be selectively measured by an optical microscope and/or a scanning electron microscope (SEM), but the disclosure is not limited thereto. In addition, there may be a certain error between any two values or directions used for comparison. If a first value is equal to a second value, it is implied that there may be an error of about 10% between the first value and the second value; if a first direction is perpendicular to a second direction, the angle between the first direction and the second direction may be 80 degrees to 100 degrees; and if the first direction is parallel to the second direction, the angle between the first direction and the second direction may be 0 degrees to 10 degrees.

The terms "about", "substantially", or "approximately" are "generally" interpreted as being within a range of plus or minus 20% of a given value or range, or as being within a range of plus or minus 10%, plus or minus 5%, plus or minus 3%, plus or minus 2%, plus or minus 1%, or plus or minus 0.5% of the given value or range.

Reference will now be made in detail to the exemplary embodiments of the disclosure, examples of which are illustrated in the accompanying drawings. Whenever possible, the same reference numerals are used to represent the same or similar parts in the accompanying drawings and description.

In the disclosure, the features of multiple embodiments to be described below may be replaced, recombined, or mixed to form other embodiments without departing from the spirit of the disclosure. The features of multiple embodiments may be used in combination as long as such combination does not depart from the spirit of the disclosure or lead to conflict.

In the disclosure, the electronic device may include a display device, a touch display device, a light-emitting device, an antenna device, a sensing device, a splicing device, or electronic devices of any suitable types, but is not limited thereto.

The electronic device may include an inorganic light-emitting diode (LED), such as a micro-LED/mini-LED, a quantum dot (QD) material, a quantum dot light-emitting diode (QLED/QDLED), a fluorescence material, a phosphor material, other suitable materials or a combination of the above, but is not limited thereto.

In addition, the electronic device may be a color display device or a monochrome display device, the shape of the electronic device may be a rectangle, a circle, a polygon, a shape with curved edges or other suitable shapes. In the disclosure, the electronic device is rectangular and is a color electronic device as an example, but is not limited thereto.

FIG. 1A to FIG. 1D are schematic views showing part of a manufacturing process of an electronic device according to an embodiment of the disclosure. The electronic device 100A comprises a first substrate 110, a plurality of light-emitting dies 120, a transparent material layer 150P, a sealing material 160 and a second substrate 140, but is not limited thereto.

Referring to FIG. 1A, a first substrate 110 is provided, and a plurality of light-emitting dies 120 are disposed on the first substrate 110. The first substrate 110 includes a first substrate body 112 and/or a component layer 114. The component layer 114 is disposed on the first substrate body 112, the plurality of light-emitting dies 120 are disposed on the component layer 114 and electrically connected to the component layer 114. In some embodiments, the material of the first substrate body 112 may include a transparent substrate or a non-transparent substrate. In some embodiments, the first substrate body 112 may include a rigid substrate, a flexible substrate or a combination thereof, but is not limited thereto. For example, the material of the first substrate body 112 includes glass, quartz, sapphire, ceramic, polycarbonate (PC), polyimide (PI), polyethylene terephthalate (PET), rubber, other suitable materials or a combination of the above materials, but is not limited thereto. The component layer 114 includes a circuit structure configured to drive the light-emitting dies 120. For example, the component layer 114 may include a plurality of scan lines, a plurality of data lines, a plurality of transistors, and/or a plurality of electrodes, but is not limited thereto. The plurality of light-emitting dies 120 may be disposed on the first substrate 110 in an array, but is not limited thereto. In some embodiments, the light-emitting die 120 may be electrically connected to the component layer 114 via a conductive pad (not shown), but is not limited thereto. In some embodiments, the light-emitting die 120 may emit blue light, UV light or another suitable color light, but is not limited thereto. In some embodiments, the light-emitting die 120 may include a p-type semiconductor layer and an n-type semiconductor layer, but is not limited thereto. In some embodiments, the light-emitting die 120 may include a micrometer-level or millimeter-level light-emitting die, but is not limited thereto, and the size of the light-emitting die 120 may be adjusted according to the requirements. In some embodiments, the electronic device is a display device, the electronic device may include a display region AR and a non-display region NR surrounding the display region AR, the plurality of light-emitting dies 120 are disposed in the display region AR. As shown in FIG. 1A to FIG. 1D and FIG. 2, the region of the display region AR may be substantially defined as a smallest region including all the light-emitting dies 120. As shown in FIG. 2, the region of the display region AR is rectangular, but is not limited thereto. The shape of the region of the display region AR may be adjusted according to the requirements and may include a triangle, a shape with curved edges, a polygon or another irregular shape, but is not limited thereto.

Referring to FIG. 1A, the electronic device comprises a filler layer 130, and the filler layer 130 may be disposed on the first substrate 110. The filler layer 130 is disposed adjacent to or around the light-emitting dies 120. In some embodiments, as shown in FIG. 1A, the filler layer 130 is disposed between the plurality of light-emitting dies 120. In some embodiments, the filler layer 130 may be configured to fix or protect the light-emitting dies 120. In some embodiments, in a cross section (e.g., the one shown in FIG. 1A), a maximum distance Da between the upper surface (i.e., the surface away from the first substrate body 112) of the filler layer 130 and the first substrate body 112 may be less than or equal to a maximum distance Db between the upper surface (i.e., the surface away from the first substrate body 112) of the light-emitting die 120 and the first substrate body 112. In some embodiments (not shown), in a cross section, the maximum distance Da between the filler layer 130 and the first substrate body 112 may be greater than or equal to the maximum distance Db between the light-emitting die 120 and the first substrate body 112. In some embodiments (not shown), the filler layer 130 may cover at least part of the light-emitting die 120. In some embodiments, the filler layer 130 may include a transparent material, a non-transparent material or a combination thereof. In some embodiments, the filler layer 130 may include a single-layer structure or a composite-layer structure. In some embodiments, the filler layer 130 may have light-shielding properties. In some embodiments, the material of the filler layer 130 may include an epoxy resin material, an acrylic material other suitable materials, or a combination thereof.

Referring to FIG. 1A, in some embodiments, the electronic device includes a second substrate 140, and the second substrate 140 is disposed opposite to the first substrate 110. In some embodiments, the second substrate 140 includes a second substrate body 142, a light-shielding pattern layer BK, a plurality of color filter structures CF and/or a plurality of wavelength conversion structures WT. The second substrate body 142 may have the same or similar material as the first substrate body 112, which will not be repeatedly described herein. In some embodiments, the light-shielding pattern layer BK is adjacent to or surrounds the color filter structures CF and/or the wavelength conversion structures WT. In some embodiments, the light-shielding pattern layer BK has multiple openings and forms a grid structure. In some embodiments, in a normal direction Z of the second substrate body 142, the color filter structure CF overlaps the opening of the grid structure. In some embodiments, the material of the light-shielding pattern layer BK may include a black resin, a black photoresist, a metal or a combination thereof, but is not limited thereto. In some embodiments, the color filter structures CF are respectively disposed correspondingly on the light-emitting dies 120 to adjust or convert the color of the light emitted by the light-emitting dies 120. The color filter structure CF may include a red filter structure, a green filter structure, a blue filter structure or filter structures of other suitable colors, but is not limited thereto. In some embodiments, as shown in FIG. 1A, the color filter structure CF is disposed between the wavelength conversion structure WT and the second substrate body 142. In the normal direction Z of the second substrate body 142, the wavelength conversion structure WT may overlap the color filter structure CF. In some embodiments, the material of the wavelength conversion structure WT may include a quantum dot material, a phosphor material, a fluorescence material, other suitable wavelength conversion materials or a combination thereof, but is not limited thereto. In other words, the wavelength conversion structure WT can convert the light emission wavelength of the light-emitting die 120 into light of another wavelength. In some embodiments, the wavelength range converted by the wavelength conversion structure WT may substantially correspond to the color of the color filter structure CF. For example, in the normal direction Z of the second substrate body 142, the red wavelength conversion structure and the red filter structure may overlap each other, the green wavelength conversion structure and the green filter structure may overlap each other, and the blue wavelength conversion structure and the blue filter structure may overlap each other, but the disclosure is not limited thereto.

Figure 1B:
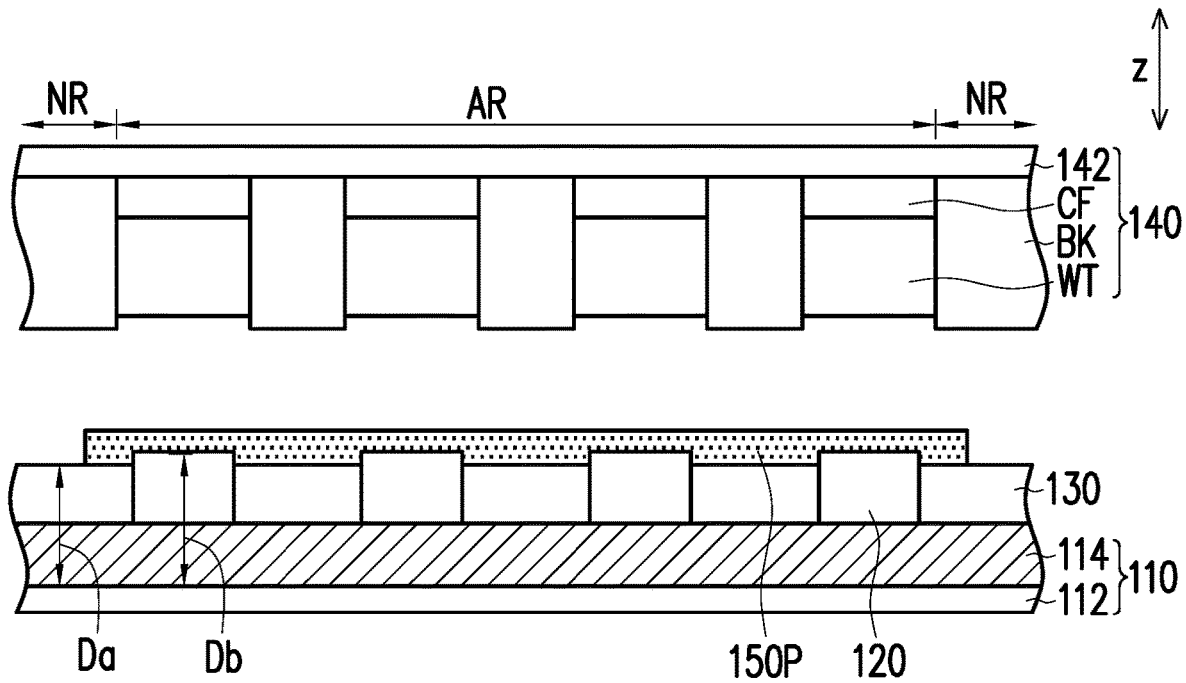
Figure 2:
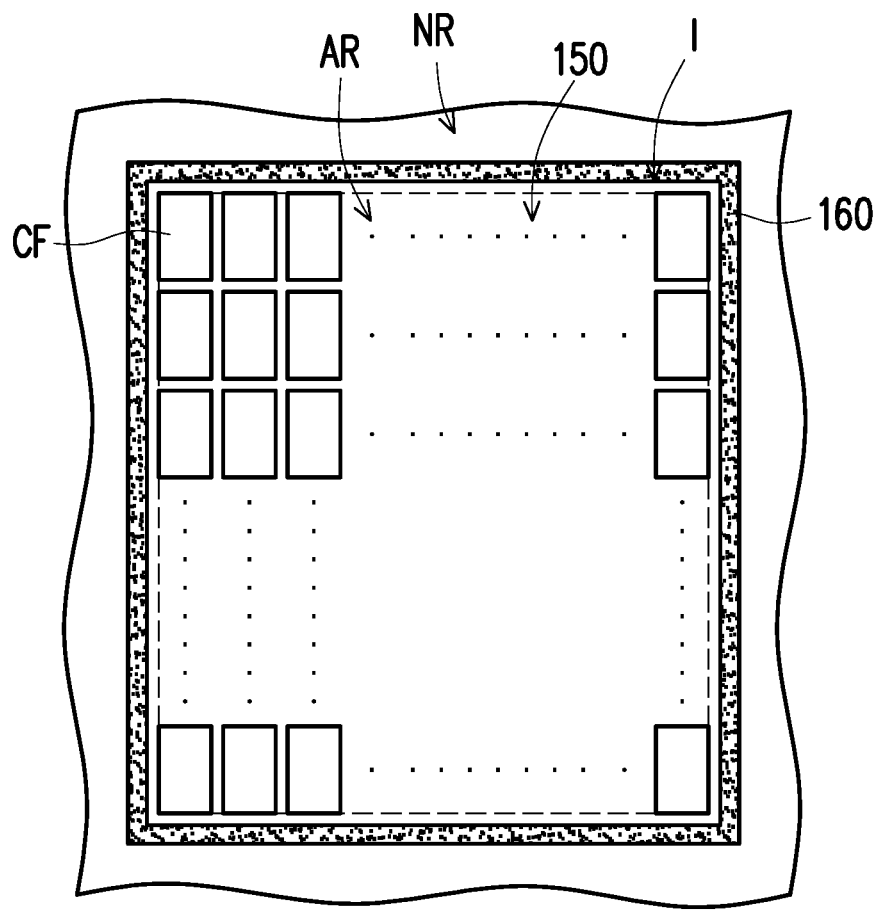
FIG. 2 is a schematic top view showing an electronic device according to an embodiment of the disclosure.

Referring to FIG. 1B, in some embodiments, a transparent material layer 150P may be disposed on the first substrate 110, and the transparent material layer 150P is disposed on the filler layer 130 and/or the plurality of light-emitting dies 120. In some embodiments, the transparent material layer 150P may cover the plurality of light-emitting dies 120. In some embodiments, the transparent material layer 150P is disposed on the first substrate 110 by a coating method. The coating method includes a screen printing method, a dispenser coating method, a multi-nozzle coating method, a slit coating method, a gravure printing method, an inkjet printing method, an offset printing method, a relief printing method or other suitable methods, but is not limited thereto. It noted that the transparent material layer 150P is not limited to being disposed on the first substrate 110. In other embodiments, the transparent material layer 150P may be disposed on the second substrate 140. In some embodiments, the light transmittance of the material of the transparent material layer 150P is greater than or equal to 90% (≥90%) (e.g., a material having a light transmittance between 95% and 99% (95%≤light transmittance≤99%). In some embodiments, the material of the transparent material layer 150P may include an optical clear resin (OCR) or an optical clear adhesive (OCA), the material of the transparent material layer 150P may include an acrylic resin, a silicone resin, an epoxy resin, other suitable materials or a combination of the above materials, but is not limited thereto. In some embodiments, the transparent material layer 150P may have water/oxygen barrier properties or protection properties, but is not limited thereto. In some embodiments, the transparent material 160 includes a waterproofing material. In some embodiments, the transparent material layer 150P may have flowability before curing, when the first substrate 110 and the second substrate 140 are subsequently assembled, the transparent material layer 150P can be more uniformly disposed between the second substrate 140 and the first substrate 110, thereby improving the quality of the electronic device. In some embodiments, before curing, the transparent material layer 150P has a viscosity range, the viscosity range may be in a range between 10 mPa·s and 200 mPa·s (10 mPa·s≤viscosity≤200 mPa·s), but is not limited thereto.

Figure 1C:
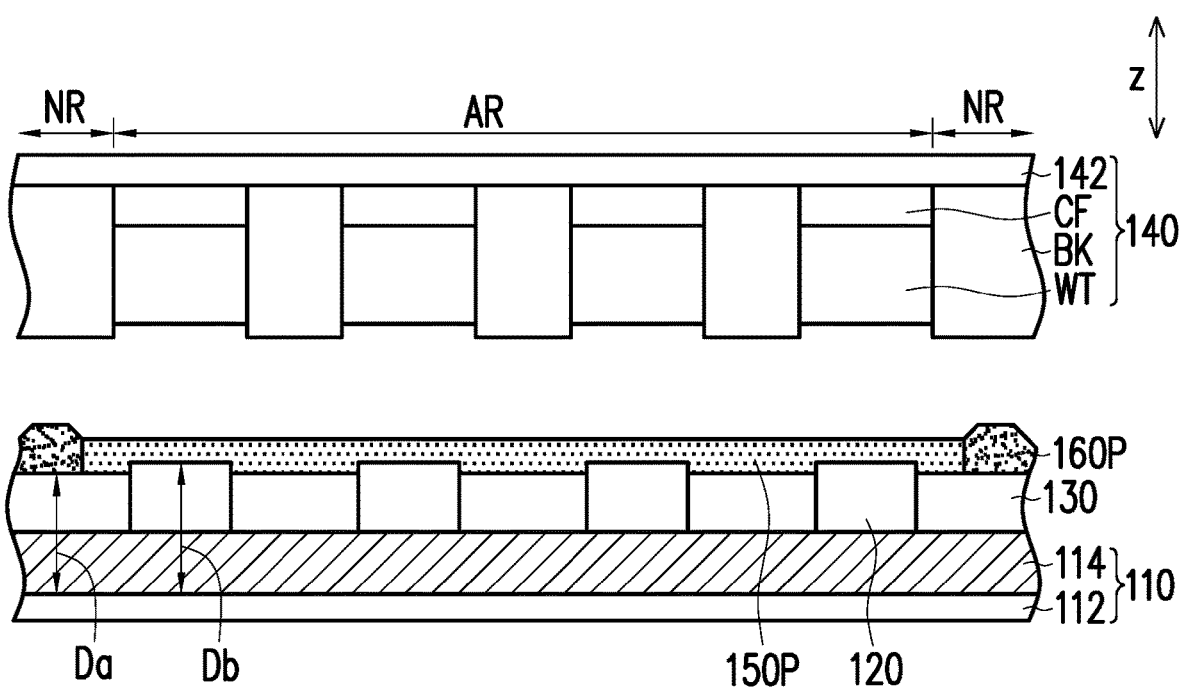

Referring to FIG. 1C, in some embodiments, a sealing material 160P is disposed on the first substrate 110. In some embodiments, the sealing material 160P surrounds the transparent material layer 150P and is located in the non-display region NR, but is not limited thereto. In some embodiments, the sealing material 160P is disposed on the first substrate 110 through a coating method similar to that of the transparent material layer 150P.

In some embodiments, the transparent material layer 150P and/or the sealing material 160P may be coated by a spray coating or inkjet coating apparatus. The spray coating or inkjet coating apparatus may include an ink jet printer, a jet dispenser, a slit coater, an aerosol jet or a super-fine ink jet printer, but it is not limited thereto. In some embodiments, the sealing material 160P may be disposed on the first substrate 110 through adhesion. In some embodiments (not shown), a plurality of sealing materials 160P may be disposed. In some embodiments (not shown), in the top view, the plurality of sealing materials 160P are respectively annular patterns, and the sealing materials 160P sequentially surround the transparent material layer 150. Moreover, the plurality of sealing materials 160P may contact each other after assembly and/or curing to improve the integrity of the sealing material surrounding the transparent material layer 150 after assembly. For example, a first annular sealing material 160P may be disposed first, and then another annular sealing material 160P may be disposed, but the disclosure is not limited thereto. In other embodiments, the plurality of sealing materials 160P may be disposed at the same time. In some embodiments (not shown), in the top view, the plurality of sealing materials 160P may include a plurality of segments, and the segments of the sealing materials 160P surround the transparent material layer 150. Moreover, the plurality of sealing materials 160P may contact each other after assembly and/or curing, but are not limited thereto. In some embodiments, the contour shapes of the plurality of sealing materials 160P projected onto the first substrate 110 may be the same or different. The materials of the plurality of sealing materials 160P may be the same or different. It is noted herein that the sealing material 160P is not limited to being disposed on the first substrate 110. In other embodiments, the sealing material 160P may be disposed on the second substrate 140. After the transparent material layer 150P and the sealing material 160P are disposed on the first substrate 110 or the second substrate 140, the first substrate 110 and the second substrate 140 may be assembled the sealing material 160P surrounds the transparent material layer 150. For example, the first substrate 110 and the second substrate 140 may be assembled in a vacuum environment. Subsequently, the sealing material 160P may be cured. The curing includes pre-curing, and the detailed process thereof will be described in FIG. 3. In some embodiments, before curing, the viscosity of the sealing material 160P may be greater than the viscosity of the transparent material layer 150P. In some embodiments, the material of the sealing material 160P may be the same as or similar to the material of the transparent material layer 150P. However, the material of the sealing material 160P includes more polymer long chains, the viscosity of the sealing material 160P is greater than the viscosity of the transparent material layer 150P, but the disclosure is not limited thereto. In some embodiments, the viscosity of the sealing material 160P is 1000 times or more the viscosity of the transparent material layer 150P, but is not limited thereto. In some embodiments, the viscosity range of the sealing material 160P may be between 250 Pa·s and 350 Pa·s (250 Pa·s≤viscosity≤350 Pa·s), but is not limited thereto. In some embodiments, the sealing material 160P may include a photoinitiator, the sealing material 160P can be cured by light irradiation, but the disclosure is not limited thereto.

In some embodiments, in the normal direction Z of the second substrate body 142, the sealing material 160P does not overlap or cover the plurality of light-emitting dies 120. In other embodiments, in the normal direction Z of the second substrate body 142, the sealing material 160P may overlap or cover part of the light-emitting dies 120. In that case, the sealing material 160P may selectively include a material having high transmittance properties (e.g., a material having a transmittance greater than or equal to 90% (≥90%)).

Figure 1D:
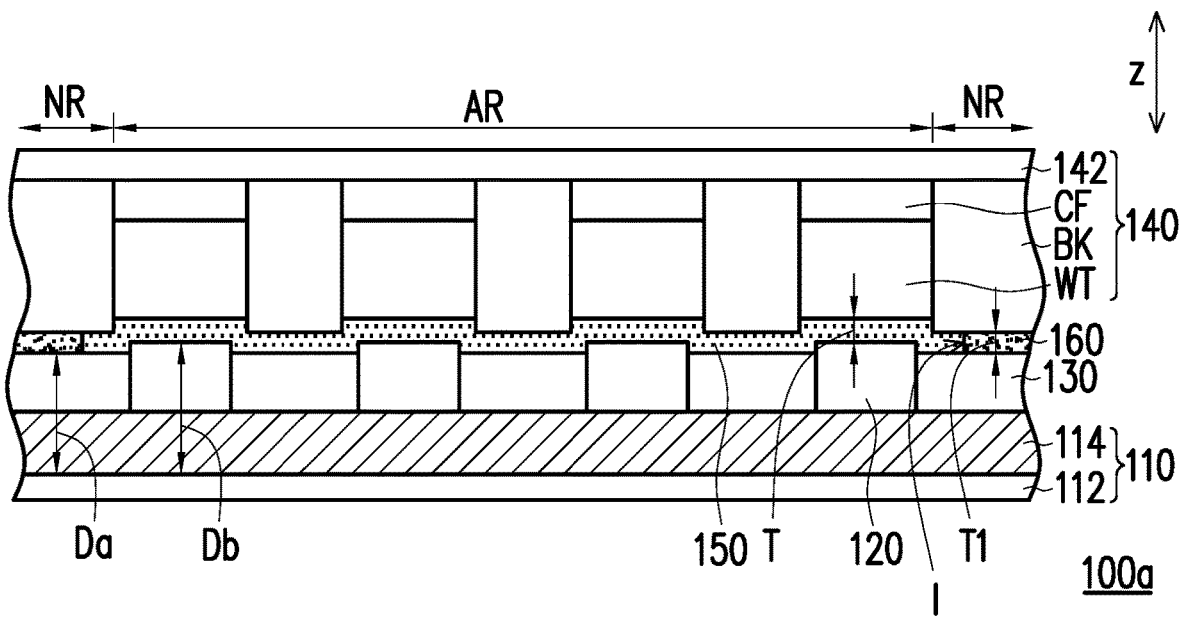

Referring to FIG. 1D, the first substrate 110 and the second substrate 140 are assembled to form an electronic device 100a. The assembling of the first substrate 110 and the second substrate 140 includes the following steps. First, the second substrate 140 is pressed down, and the first substrate 110 and the second substrate 140 are adhered through the transparent material layer 150P and/or the sealing material 160P. The transparent material layer 150P contacts with the sealing material 160P, and the assembling step may be performed in a vacuum environment. Afterwards, the sealing material 160P is irradiated with light (e.g., ultraviolet light, but is not limited thereto) to perform pre-curing, but the disclosure is not limited thereto. Next, the transparent material layer 150P and the sealing material 160P are heated to perform curing, but it is not limited thereto. In some embodiments, the pre-curing and the curing are performed in a non-vacuum environment (e.g., a general atmospheric pressure environment). When the transparent material layer 150P and the sealing material 160P are moved from a vacuum environment to a non-vacuum environment (e.g., a general atmospheric pressure environment), the sealing material 160P may be squeezed due to the difference in internal and external pressures. Therefore, the sealing material 160P may selectively be a material having a greater viscosity to reduce defects (e.g., fractures and cracks caused by air puncture) of the sealing material 160P resulting from the pressing pressure, and the defects may lead to presence of air between the first substrate 110 and the second substrate 140, or affect the service life of the electronic device (e.g., shortening the service life of the light-emitting die 120) or reliability of the electronic device. In some embodiments, the hardness of the sealing material 160 after curing may be greater than the hardness of the transparent material layer 150 after curing, but is not limited thereto. In some embodiments, a hardness of the transparent material layer 150 is different from a hardness of the sealing material 160. At this time, the production of the electronic device 100a is completed. Through the configuration relationship and/or material selection of the transparent material layer 150P and the sealing material 160P as described above, it is possible to reduce the probability of the presence of air between the second substrate 140 and the first substrate 110, or to improve the service life or reliability of the electronic device.

Although the method of manufacturing the electronic device 100a of this embodiment has been described with the above method as an example, the method of forming the electronic device 100a of the disclosure is not limited thereto, and part of the above steps may be deleted or other steps may be added according to the requirements. In addition, the sequence of the above steps may be adjusted according to the requirements.

In some embodiments, a thickness T of the transparent material layer 150 in the electronic device 100a after the first substrate 110 and the second substrate 140 are assembled may be greater than or equal to 2 μm and less than or equal to 20 μm (2 μm≤thickness T≤20 μm), but is not limited thereto. The thickness T is the maximum thickness of the transparent material layer 150 in a cross section. For example, the thickness T of the transparent material layer 150 is between 3 μm and 10 μm (3 μm≤thickness T≤10 μm), or between 5 μm and 15 μm (5 μm≤thickness T≤15 μm). In some embodiments, as shown in FIG. 1D, a thickness T1 of the sealing material 160 may be greater than or equal to 2 μm and less than or equal to 20 μm (2 μm≤thickness T1≤20 μm), but is not limited thereto. The thickness T1 is the maximum thickness of the sealing material 160 in a cross section. For example, the thickness T1 of the sealing material 160 is between 3 μm and 10 μm (3 μm≤thickness T1≤10 μm), or between 5 μm and 15 μm (5 μm≤thickness T1≤15 μm). Through the above design of the thickness T and/or the thickness T1, it is possible to reduce the distance between the light-emitting die 120 and the wavelength conversion structure WT in the normal direction Z of the second substrate body 142, or reduce irradiation of light emitted by the light-emitting die 120 to the non-corresponding wavelength conversion structure WT, which would cause interference and affect the display of the image.

Referring to FIG. 1D and FIG. 2, FIG. 1D is a schematic cross-sectional view showing an electronic device according to an embodiment of the disclosure, and FIG. 2 is a schematic top view showing an electronic device according to an embodiment of the disclosure. For clarity of the drawing, FIG. 2 mainly shows the color filter structure CF, the transparent material layer 150, and the sealing material 160, and other components are omitted. The transparent material layer 150 of FIG. 2 is disposed in the display region AR of the electronic device 100a, and the sealing material 160 is disposed in the non-display region NR of the electronic device 100a and surrounds the transparent material layer 150. Therefore, the user will not see the sealing material 160 when viewing the electronic device 100a. In some embodiments, as shown in FIG. 2, the sealing material 160 may be in contact with the transparent material layer 150, and an interface I between the sealing material 160 and the transparent material layer 150 may be located in the non-display region NR, but is not limited thereto.

Figure 3:
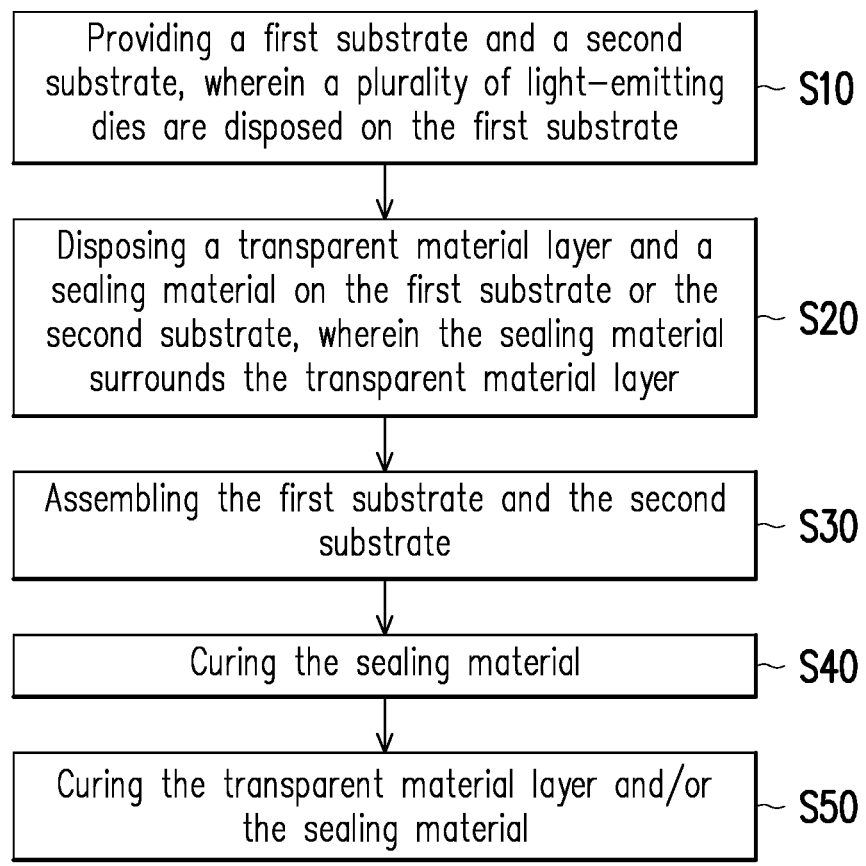
FIG. 3 is a flowchart showing a method of manufacturing an electronic device according to an embodiment of the disclosure.

FIG. 3 is a flowchart showing a method of manufacturing an electronic device according to an embodiment of the disclosure. It is noted that may the reference numerals and part of the contents of the embodiment of FIG. 1A to FIG. 1D may apply to the embodiment of FIG. 3, where the same or similar numerals are used to indicate the same or similar components, and descriptions of the same technical contents are omitted. In addition, this flowchart is only an example and is not intended to limit the manufacturing steps of the electronic device.

In step S10, providing a first substrate 110 and a second substrate 140, and a plurality of light-emitting dies 120 are disposed on the first substrate 140. In step S10, the first substrate 110 and/or the second substrate 140 may be selectively cleaned. For example, the first substrate 110 and/or the second substrate 140 may be cleaned by an ion gun.

In step S20, disposing a transparent material layer 150P and a sealing material 160P on the first substrate 110 or the second substrate 140, and the sealing material 160P surrounds the transparent material layer 150P. Reference may be made to the foregoing embodiment for the methods of disposing the transparent material layer 150P and the sealing material 160P, which shall not be repeatedly described herein.

In step S30, assembling the first substrate 110 and the second substrate 140. In step S30, the first substrate 110 and the second substrate 140 may be moved to a vacuum environment to perform assembly.

In step S40, curing the sealing material 160P. The curing in step S40 includes pre-curing, but is not limited thereto. For example, the first substrate 110 and the second substrate 140 are moved from the vacuum environment, and the sealing material 160P is irradiated with light (e.g., ultraviolet light) to perform pre-curing, but it is not limited thereto. Through the above pre-curing step, it is possible to reduce adverse phenomena, such as uneven brightness and/or chromatic aberration resulting from displacement of the first substrate 110 and the second substrate 140.

In step S50, curing the transparent material layer 150P and/or the sealing material 160P. The curing in step S50 includes thermal curing, photo curing, other suitable curing methods or a combination thereof. In some embodiments, the thermal curing in step S50 may be performed by an oven or a hot plate, but is not limited thereto. After the above steps, the first substrate 110 and the second substrate 140 can be adhered through the transparent material layer 150 and/or the sealing material 160 to complete the production of the electronic device 100a.

Figure 4:
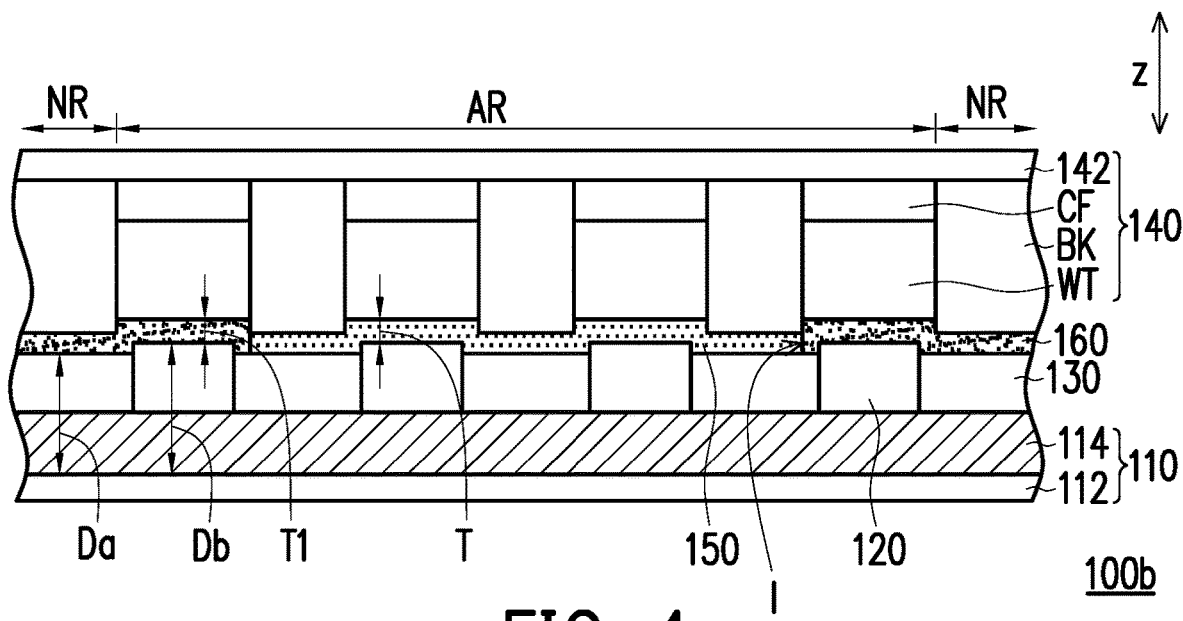
FIG. 4 is a schematic cross-sectional view showing an electronic device according to another embodiment of the disclosure.
Figure 5:
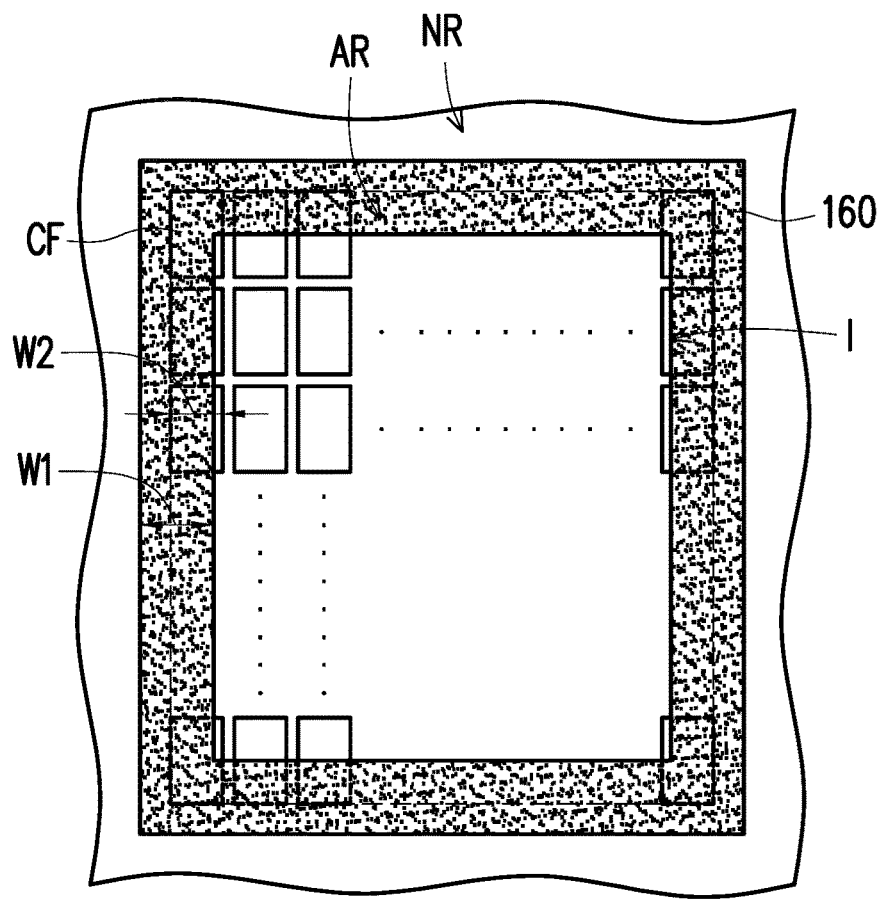
FIG. 5 is a schematic top view showing an electronic device according to another embodiment of the disclosure.

FIG. 4 is a schematic cross-sectional view showing an electronic device 100b according to another embodiment of the disclosure, and FIG. 5 is a schematic top view showing an electronic device according to another embodiment of the disclosure. The main difference between the electronic device 100b of FIG. 4 and the electronic device 100a in that the sealing material 160 of the electronic device 100b is further disposed in the display region AR and overlaps or covers part of the light-emitting dies 120 in the normal direction Z of the second substrate body 142. In some embodiments, the sealing material 160 is disposed on at least one of the plurality of light-emitting dies 120. In other words, the interface I between the sealing material 160 and the transparent material layer 150 is located in the display region AR. In some embodiments, the sealing material 160 is in contact with the filler layer 130. In that case, the material of the sealing material 160 may selectively have high transmittance properties (e.g., having a light transmittance greater than 90% or even having a light transmittance greater than 95%). In some embodiments, as shown in FIG. 5, in the normal direction Z of the second substrate body 142, the sealing material 160 may at least partially overlap the color filter structures CF located at the periphery. In some embodiments, as shown in FIG. 5, in the normal direction Z of the second substrate body 142, the projection contour of the sealing material 160 is not limited to a hollow rectangle, the shape of the projection contour of the sealing material 160 may be adjusted according to the requirements, the shape of the projection contour of the sealing material 160 may include a triangle, a shape with curved edges, a polygon or other irregular shapes, but is not limited thereto. In some embodiments, as shown in FIG. 5, a width W1 of the sealing material 160 may be greater than or equal to a width W2 of the color filter structure CF of the electronic device. In some embodiments (as shown in FIG. 4 and FIG. 5), the width W1 of the sealing material 160 may be greater than or equal to the width of a sub-pixel, and the width of the sub-pixel may be defined by the opening of the light-shielding pattern layer BK, but is not limited thereto.

Figure 6:
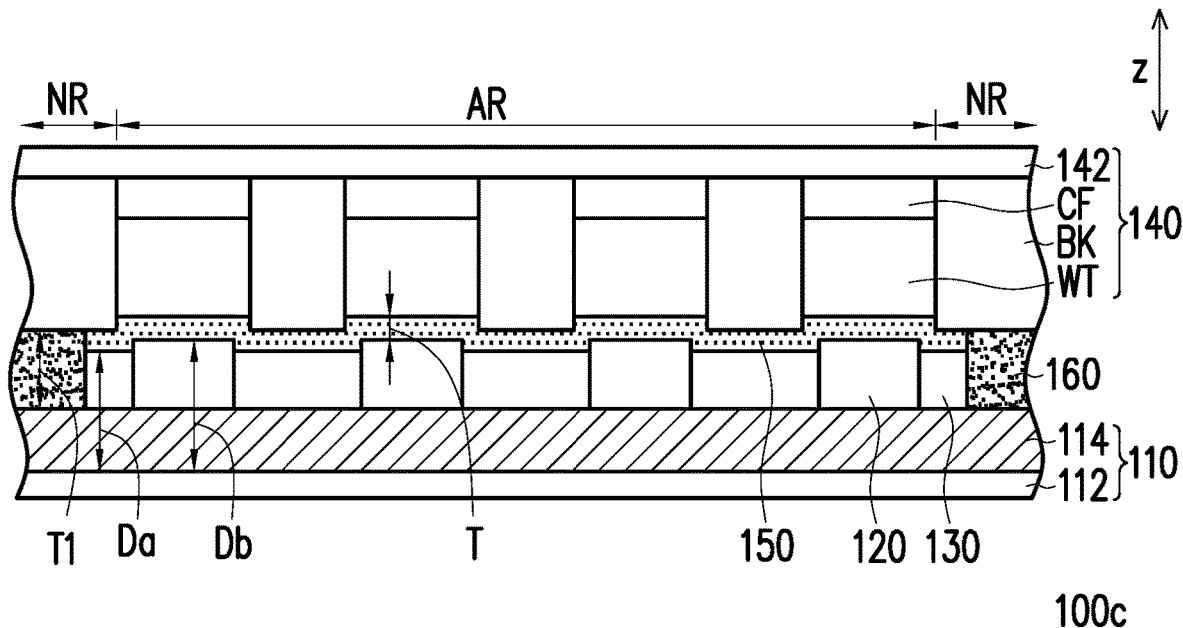
FIG. 6 is a schematic cross-sectional view showing an electronic device according to another embodiment of the disclosure.

FIG. 6 is a schematic cross-sectional view showing an electronic device 100c according to another embodiment of the disclosure. The main difference between the electronic device 100c and the electronic device 100a above lies in that the sealing material 160 of the electronic device 100c may be in contact with the component layer 114. In other words, the filler layer 130 may be selectively not disposed between the sealing material 160 and the component layer 114, and the sealing material 160 may surround the filler layer 130 and the transparent material layer 150, but it not limited thereto. In some embodiments, as shown in FIG. 6, the thickness T1 of the sealing material 160 may be greater than the thickness of the filler layer 130 and/or the thickness T of the transparent material layer 150.

Figure 7:
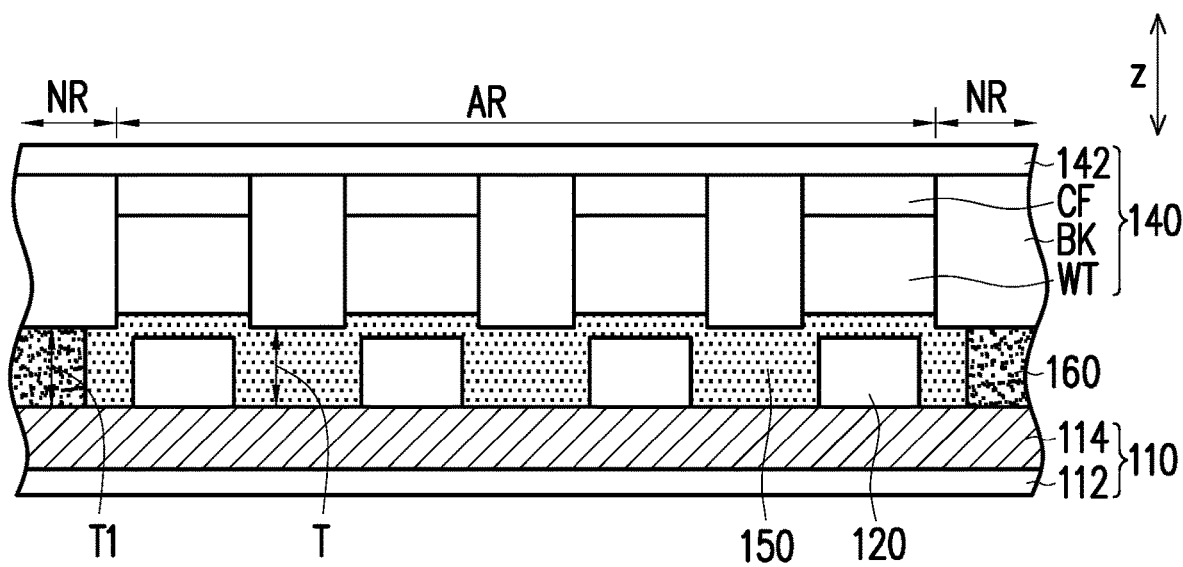
FIG. 7 is a schematic cross-sectional view showing an electronic device according to another embodiment of the disclosure.

FIG. 7 is a schematic cross-sectional view showing an electronic device 100d according to another embodiment of the disclosure. The main difference between the electronic device 100d and the electronic device 100a above lies in that the electronic device 100d may selectively not include the filler layer 130, and the sealing material 160 and/or the transparent material layer 150 may be in contact with the component layer 114.

According to the above, the sealing material in the electronic device of the embodiments of the disclosure is disposed around the transparent material layer. Before curing, the sealing material may selectively have a viscosity greater than that of the transparent material layer, or after curing, the sealing material may selectively have a hardness greater than a hardness of the transparent material layer.

Therefore, it is possible to reduce the probability of the presence of air between the first substrate and the second substrate after assembling, or improve the service life or reliability of the electronic device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device comprising
a first substrate comprising a first substrate body;

a plurality of light-emitting diodes disposed on the first substrate body;

a second substrate disposed opposite to the first substrate, comprising a second substrate body;

a transparent material layer disposed between the first substrate and the second substrate; and a sealing material disposed between the first substrate and the second substrate and surrounding the transparent material layer;

wherein a distance between a bottom surface of the sealing material and a top surface of the first substrate body is less than a distance between a top surface of the sealing material and a bottom surface of the second substrate body.

2. The electronic device according to claim 1, wherein the second substrate further comprises a color filter structure disposed on the second substrate body.

3. The electronic device according to claim 2, wherein the second substrate further comprises a wavelength conversion structure disposed on the color filter structure.

4. The electronic device according to claim 3, wherein the second substrate further comprises a light-shielding pattern layer adjacent to the wavelength conversion structure.

5. The electronic device according to claim 1, wherein the sealing material is in contact with the transparent material layer.

6. The electronic device according to claim 1, wherein the first substrate further comprises a component layer disposed on the first substrate body, and the plurality of light-emitting diodes are disposed on the component layer and electrically connected to the component layer.

7. The electronic device according to claim 6, wherein the sealing material is in contact with the component layer.

8. The electronic device according to claim 1, further comprising a filler layer at least disposed between the plurality of light-emitting diodes.

9. The electronic device according to claim 1, wherein the second substrate is adhered to the first substrate through the transparent material layer and the sealing material.

10. A method of manufacturing an electronic device, comprising:

providing a first substrate and a second substrate, wherein a plurality of light-emitting diodes are disposed on the first substrate, wherein the first substrate comprises a first substrate body and the second substrate comprises a second substrate body;

disposing a transparent material layer and a sealing material on the first substrate or the second substrate, wherein the sealing material surrounds the transparent material layer; and assembling the first substrate and the second substrate, wherein a distance between a bottom surface of the sealing material and a top surface of the first substrate body is less than a distance between a top surface of the sealing material and a bottom surface of the second substrate body.

11. The method of manufacturing an electronic device according to claim 10, wherein after the step of assembling the first substrate and the second substrate, the method further comprises curing the sealing material.

12. The method of manufacturing an electronic device according to claim 10, further comprising curing the transparent material layer.

* * * * *